(12) United States Patent
Kolan et al.

(10) Patent No.: US 7,830,006 B2
(45) Date of Patent: Nov. 9, 2010

(54) STRUCTURALLY-ENHANCED INTEGRATED CIRCUIT PACKAGE AND METHOD OF MANUFACTURE

(75) Inventors: Ravi Kanth Kolan, Singapore (SG); Hien Boon Tan, Singapore (SG); Anthony Yi Sheng Sun, Singapore (SG); Beng Kuan Lim, Singapore (SG); Krishnamoorthi Sivalingam, Singapore (SG)

(73) Assignee: United Test and Assembly Center, Ltd., Singapore (SG)

( * ) Notice: Subject to any disclaimer, the term of this patent is extended or adjusted under 35 U.S.C. 154(b) by 368 days.

(21) Appl. No.: 11/579,326

(22) PCT Filed: May 5, 2005

(86) PCT No.: PCT/IB2005/003992
§ 371 (c)(1),
(2), (4) Date: Nov. 10, 2008

(87) PCT Pub. No.: WO2006/035321
PCT Pub. Date: Jun. 4, 2006

(65) Prior Publication Data
US 2009/0072391 A1    Mar. 19, 2009

Related U.S. Application Data
(60) Provisional application No. 60/568,243, filed on May 6, 2004.

(51) Int. Cl.
*H01L 23/48* (2006.01)

(52) U.S. Cl. ............. 257/737; 257/693; 257/773; 257/780; 257/783; 257/787; 257/E23.021; 257/E23.069; 438/612; 438/613; 438/614

(58) Field of Classification Search ............. 257/670, 257/673, 669, 690, 693, 737, 738, 777, 778, 257/E23.021, E23.069; 438/612–617; 228/180.22
See application file for complete search history.

(56) References Cited

U.S. PATENT DOCUMENTS

| | | | | |
|---|---|---|---|---|
| 6,114,187 | A  * | 9/2000 | Hayes | 438/106 |
| 7,253,520 | B2 * | 8/2007 | Yoshida et al. | 257/738 |
| 7,271,491 | B1 * | 9/2007 | Akram | 257/774 |
| 7,358,618 | B2 * | 4/2008 | Shibata | 257/791 |
| 7,514,786 | B2 * | 4/2009 | Hsu | 257/737 |
| 7,545,036 | B2 * | 6/2009 | Terui et al. | 257/728 |
| 2002/0027257 | A1 | 3/2002 | Kinsman et al. | |
| 2002/0195720 | A1 | 12/2002 | Miyazaki | |
| 2003/0235976 | A1 | 12/2003 | Zakel et al. | |

* cited by examiner

Primary Examiner—Jasmine J Clark
(74) Attorney, Agent, or Firm—Sughrue Mion, PLLC

(57) ABSTRACT

A chip scale integrated circuit package includes an integrated circuit chip which has a first face and a second face. A plurality of pillar bumps are formed on the first face of the integrated circuit chip. An encapsulant material encapsulates the sides and the first face of the integrated circuit chip, and the pillar bumps. Upper ends of the pillar bumps remain free from encapsulant material and a substantially planar surface is formed by an upper surface of the encapsulant material and the upper ends of the pillar bumps. A plurality of solder balls are mounted on the substantially planar surface in locations corresponding to the upper ends of the pillar bumps.

10 Claims, 11 Drawing Sheets

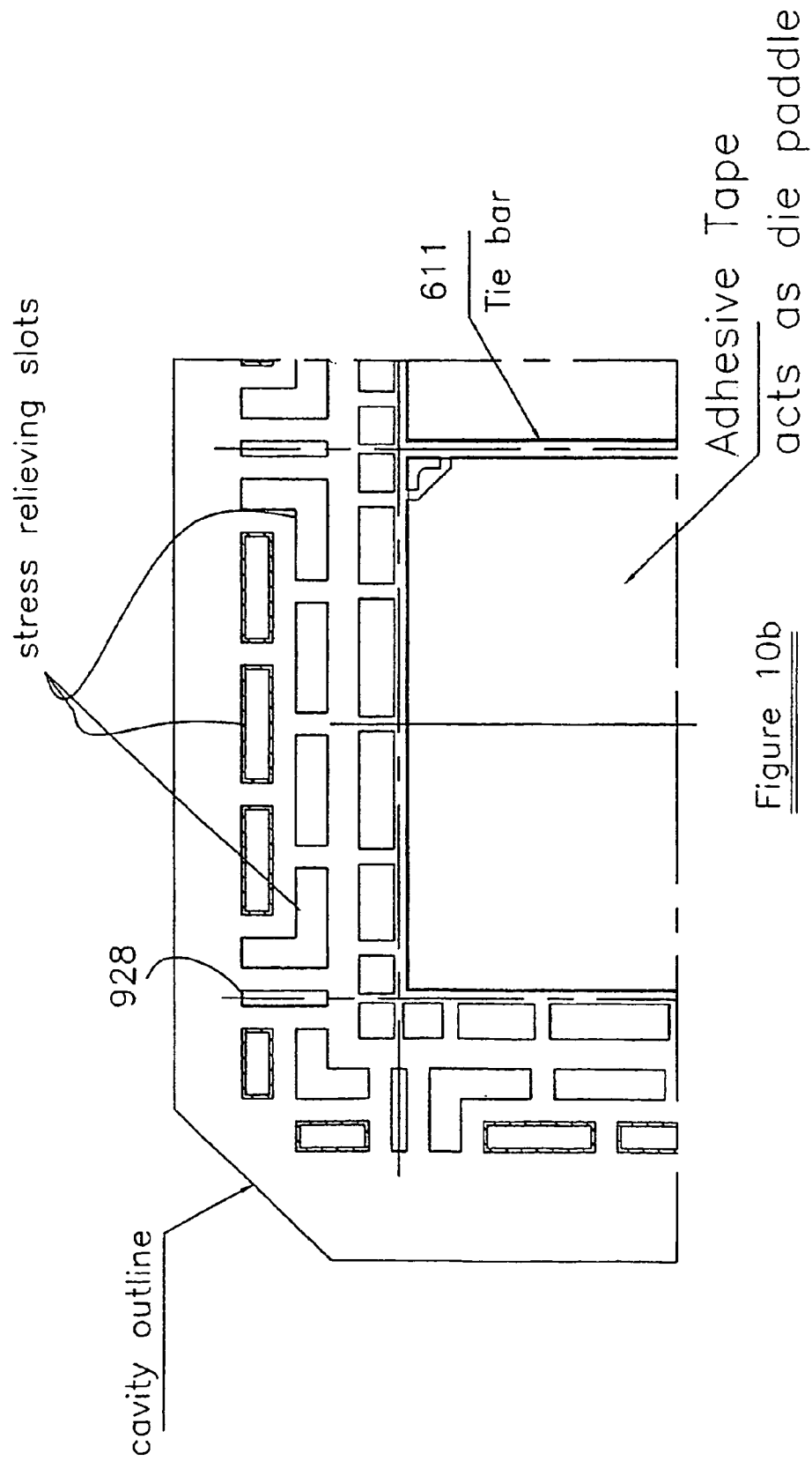

STRUCTURALLY-ENHANCED INTEGRATED CIRCUIT PACKAGE AND METHOD OF MANUFACTURE

This application claims the benefit of the U.S. Provisional Application No. 60/568,243 filed on May 6, 2004, and incorporated herein by reference.

BACKGROUND OF THE INVENTION

1. Field of the Invention

The present invention generally relates to the field of semiconductors and semiconductor packaging. In particular, the present invention relates to an improved integrated circuit (IC) package and a method of assembling the same.

2. Discussion of Related Art

Semiconductors are materials that have characteristics of insulators and conductors. In today's technology, semiconductor materials have become extremely important as the basis for transistors, diodes, and other solid-state devices. Semiconductors are usually made from germanium or silicon, but selenium and copper oxide, as well as other materials are also used. When properly made, semiconductors will conduct electricity in one direction better than they will in the other direction.

Semiconductor devices and ICs are made up of components, such as transistors and diodes, and elements such as resistors and capacitors, linked together by conductive connections to form one or more functional circuits. Interconnects on an IC chip serve the same function as the wiring in a conventional circuit.

Once the components of an IC package have been assembled, the package is typically sealed by plastic encapsulant in order to improve the strength of the package and to provide necessary protection to components within.

FIGS. 1A through 1D illustrate a wafer-level chip scale package (WLCSP) according to the prior art. According to the prior art, pillar bumped wafers are encapsulated as shown in FIG. 1A, such that the encapsulation material 15 covers the upper ends of the pillar bumps 16. After encapsulation, the molded wafer is polished, as shown in FIG. 1B to remove an upper layer of encapsulation material. Solder 17a, as shown in FIG. 1C is then printed on the upper ends of the pillar bumps 16 and is reflowed to form solder bumps 17b.

SUMMARY OF THE INVENTION

A chip scale integrated circuit package according to a first exemplary embodiment of the present invention includes an integrated circuit chip, having a first face and a second face. A plurality of pillar bumps are formed on the first face of the integrated circuit chip. An encapsulant material encapsulates the sides and the first face of the integrated circuit chip, and the pillar bumps, such that upper ends of the pillar bumps remain free form encapsulant material. A substantially planar surface is formed by an upper surface of the encapsulant material and the upper ends of the pillar bumps. A plurality of solder balls are mounted on the substantially planar surface in locations corresponding to the upper ends of the pillar bumps.

According to a second, exemplary embodiment of the present invention, a chip scale integrated circuit package includes an integrated circuit chip, having a first face and a second face. A plurality of pillar bumps are formed on the first face of the integrated circuit chip. An encapsulant material encapsulates the sides and first face of the integrated circuit chip, and the pillar bumps. Upper ends of the pillar bumps remain free form encapsulant material and a first substantially planar surface is formed by an upper surface of the encapsulant material and the upper ends of the pillar bumps. A first plurality of solder balls are mounted on the first substantially planar surface in locations corresponding to the upper ends of the pillar bumps. A second encapsulant material encapsulates the first substantially planar surface and the first plurality of solder balls such that an upper portion of each of the first plurality of solder balls remains free from the second encapsulant material. A second plurality of solder balls are mounted on the upper portions of the first solder balls.

According to an optional aspect of the first and second exemplary embodiments, the package may further include a die pad having a footprint smaller than a footprint of the integrated circuit chip and having a first face and a second face. An adhesive layer is formed on the first face of the die pad, and the second face of the integrated circuit chip is mounted on the first face of the die pad via the adhesive layer. The encapsulant material further encapsulates the second face of the integrated circuit chip and the sides of the die pad.

According to a third exemplary embodiment of the present invention, a method of assembling a chip scale integrated circuit package includes applying an adhesive to a plurality of die pad portions of a leadframe. An integrated circuit chip is mounted to each of the plurality of die pad portions via the adhesive. The footprint of each of the integrated circuit chips is larger than the footprint of each of the plurality of die pad portions. the die pad portions are attached to one another and to the frame of a carrier via a plurality of tie bars. The carrier, having the die pad portions, along with the integrated circuit chips mounted on the die pad portions, is encapsulated in a mold tooling. A release film contacts the upper rends of pillar bumps formed on the upper face of pillar bumps formed on the upper face of each of the integrated circuit chips. During the molding process, an encapsulant material is injected into the cavity formed by the mold. The release film prevents the injected encapsulant material from covering the upper ends of each of the pillar bumps, and therefore, these upper ends remain exposed.

According to a fourth exemplary embodiment of the present invention, a method of assembling a chip scale integrated circuit package includes attaching the lower face of a plurality of integrated circuit chips to a carrier. According to this embodiment, the carrier has holes in place of die pad portions. The bottom of the carrier is laminated with a one-sided adhesive tape which is resistant to high temperatures. The adhesive tape is therefore accessible through the holes in the carrier and the integrated circuit chips are mounted to these accessible portions of the adhesive tape.

According to an optional aspect of the third and fourth exemplary embodiments, the method further includes applying a layer of second encapsulant material around the solder balls such that an upper portion of each of the solder balls remains free from the layer of second encapsulant material. Then, a second plurality of solder balls are affixed to the upper portions of each of the plurality of solder balls.

BRIEF DESCRIPTION OF THE DRAWINGS

These and other features, aspects, and advantages of the present invention will become better understood with reference to the following description, amended claims, and accompanying drawings, which should not be read to limit the invention in any way, in which:

FIG. 6b illustrates an enlarged view of a leadframe panel of the carrier of FIG. 6a.

FIGS. 10A and 10B illustrate a carrier frame having fiducials.

DETAILED DESCRIPTION OF THE INVENTION

The present invention will be explained in further detail with reference to the accompanying drawings.

Figure 1A:
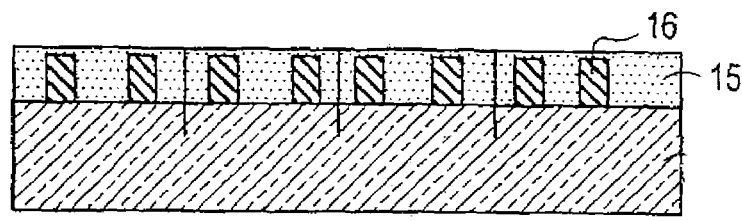
FIGS. 1A through 1D illustrate a wafer-level chip scale package (WLCSP) and a method of manufacture according to the prior art.
Figure 1B:
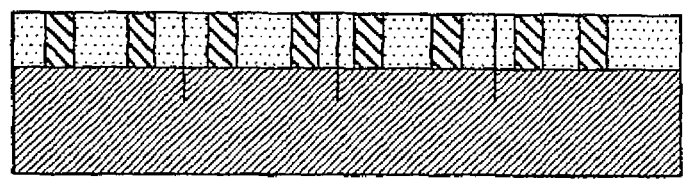
Figure 1C:
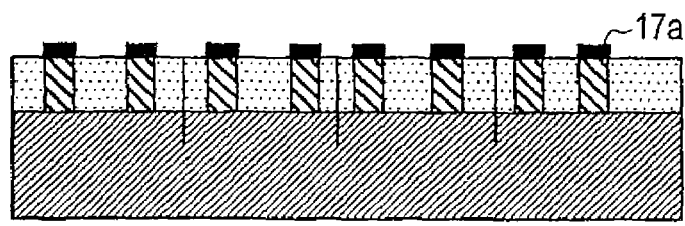
Figure 1D:
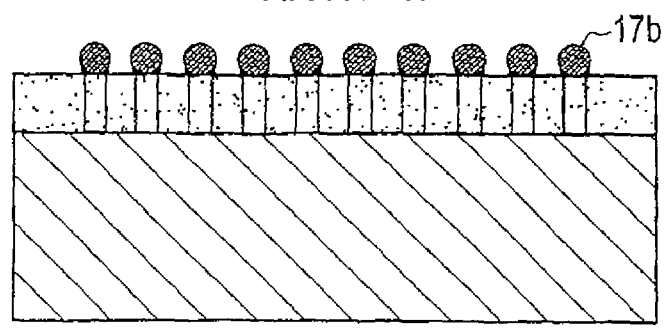
Figure 2A:
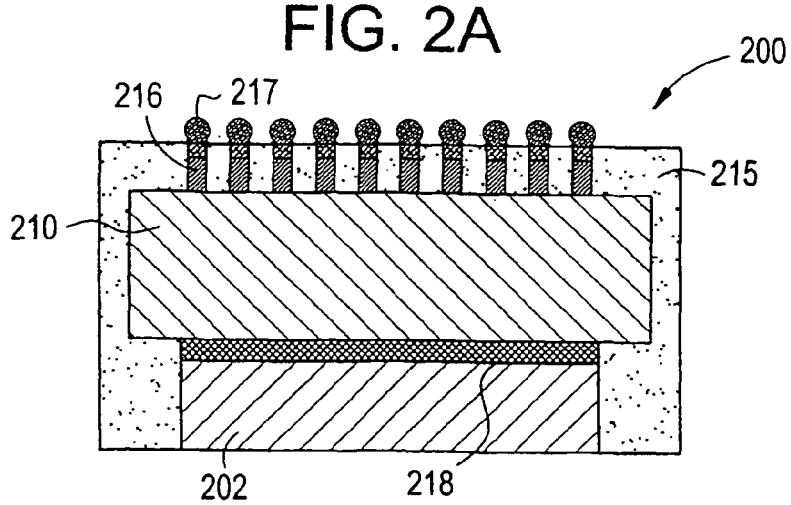
FIGS. 2A and 2B illustrate a structurally-enhanced IC package 200 according to a first exemplary embodiment of the present invention.

FIG. 2A illustrates a structurally-enhanced IC package 200 according to a first exemplary embodiment of the present invention. The package 200 includes a base support 202. The base support is formed from a leadframe to which the IC chip 210 is attached, as described below with respect to the third exemplary embodiment. The leadframe and base support may be formed from a common copper (Cu) alloy such as C194, C7025, C151, or Eftec64T, or the like as would be understood by one of skill in the art. The base support may also function as a heat sink to draw heat away from the IC chip 210.

A singulated IC chip 210 is mounted to the base support 202 via an adhesive material 218. The adhesive material may be an electrically conductive or non-conductive epoxy, paste, adhesive tape, or the like. Pillar bumps 216 are formed on the face of the IC chip 210.

The sides of the base support 202, the adhesive material 218, the IC chip 210 and the sides of the pillar bumps 216 are encapsulated by encapsulant 215, which can be a thermo-set compound, a polymer-based molding compound, or any other of many known encapsulant materials as would be understood to one of skill in the art. As in any IC chip package, the encapsulant provides overall protection to the elements it surrounds and gives added strength to the package. According to the present invention, the surrounding of not only the top and bottom faces of the IC chip, but also the sides of the IC chip with encapsulant material, provides significant added protection to the silicon of the IC chip which, if otherwise exposed would be susceptible to mechanical shocks. Another advantage of the present invention as compared to conventional wafer level chip size packages (CSPs) is that the herein proposed methods may utilize the same hardware for the manufacture of different sized integrated chips. Because the ultimate package size is larger than the IC chip, a cluster of IC chips of varying sizes can each be packaged in the same package size and will therefore be able to utilize the same test hardware with very minimal changes.

Figure 2B:
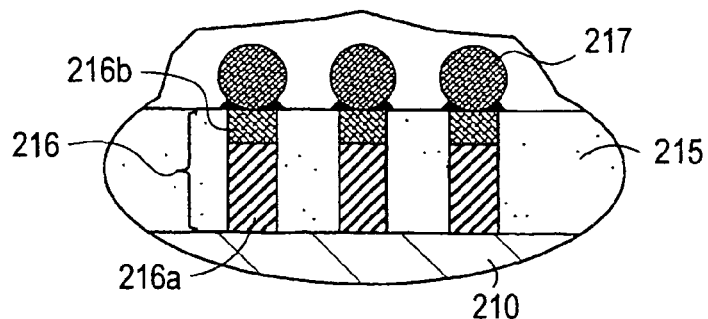

The upper surface of the encapsulant material 215 and the upper ends of the pillar bumps 216 form a substantially flat surface. Solder balls 217 are formed on the substantially flat surface in locations corresponding to the exposed ends of the pillar bumps. The solder balls and the pillar bumps may be formed from a common copper alloy or may be coated with solder material such as pure tin for better formation of solder joints during solder ball attachment. FIG. 2B illustrates an alternate pillar bump 216 which is formed of two different materials 216a and 216b.

Figure 3:
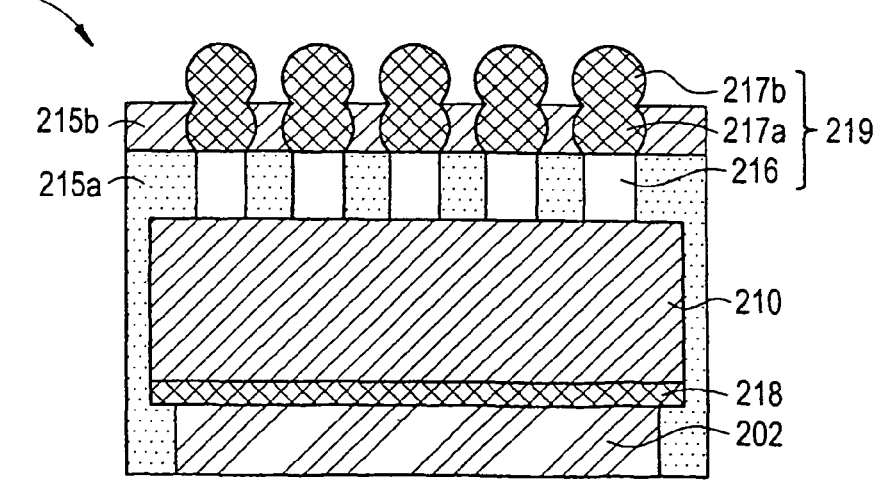
FIG. 3 illustrates a structurally-enhanced IC package 200 according to a second exemplary embodiment of the present invention.

FIG. 3 illustrates a structurally-enhanced IC package 200 according to a second exemplary embodiment of the present invention. Herein, like reference numbers refer to like elements which will not be described repeatedly in detail.

In addition to the elements described above with respect to the first exemplary embodiment, the IC package 300 includes extended joints 219, including the pillar bumps 216, a first set of solder balls 217a and a second set of solder balls 217b. The first and second solder balls of this embodiment may be formed of the same materials as described above with respect to the solder balls of the first embodiment. According to this embodiment, first solder balls 217a are surrounded by a second encapsulant 215b. The second encapsulant 215b is a conformal epoxy coating and may be a low modulus epoxy which may be formed on the package by molding or by needle dispense. The second encapsulant 215b and the upper surfaces of the first solder balls 217a form a substantially flat surface on which the second solder balls 217b are formed in locations corresponding to the upper surfaces of the first solder balls 217a. The extended joints of this embodiment improve solder joint reliability.

Figure 4:
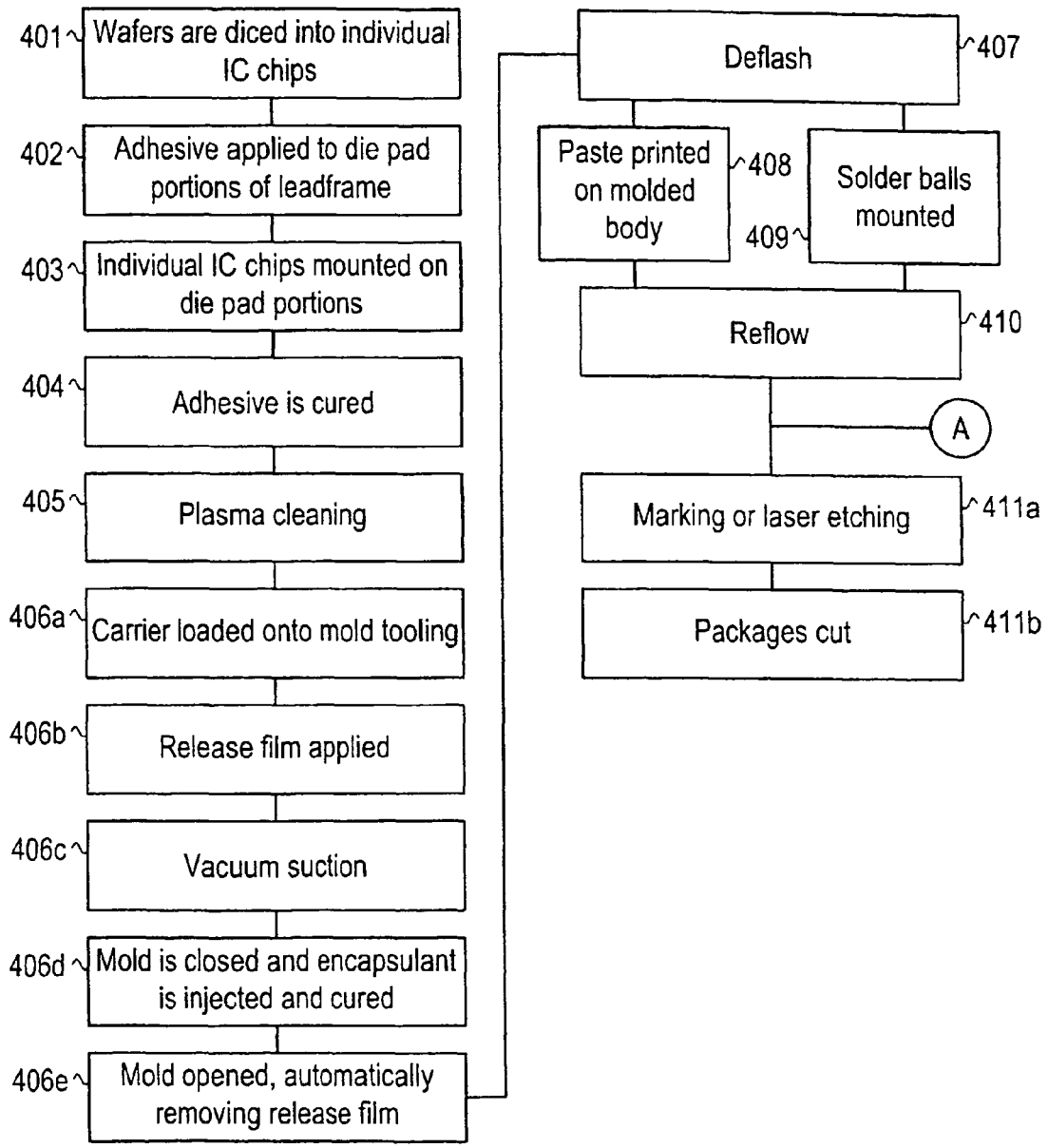
FIG. 4 is a flowchart illustrating the steps of a method of producing a structurally-enhanced IC package according to a third exemplary embodiment of the present invention.

FIG. 4 is a flowchart illustrating the steps of a method of producing a structurally-enhanced IC package according to a third exemplary embodiment of the present invention.

Figure 5:
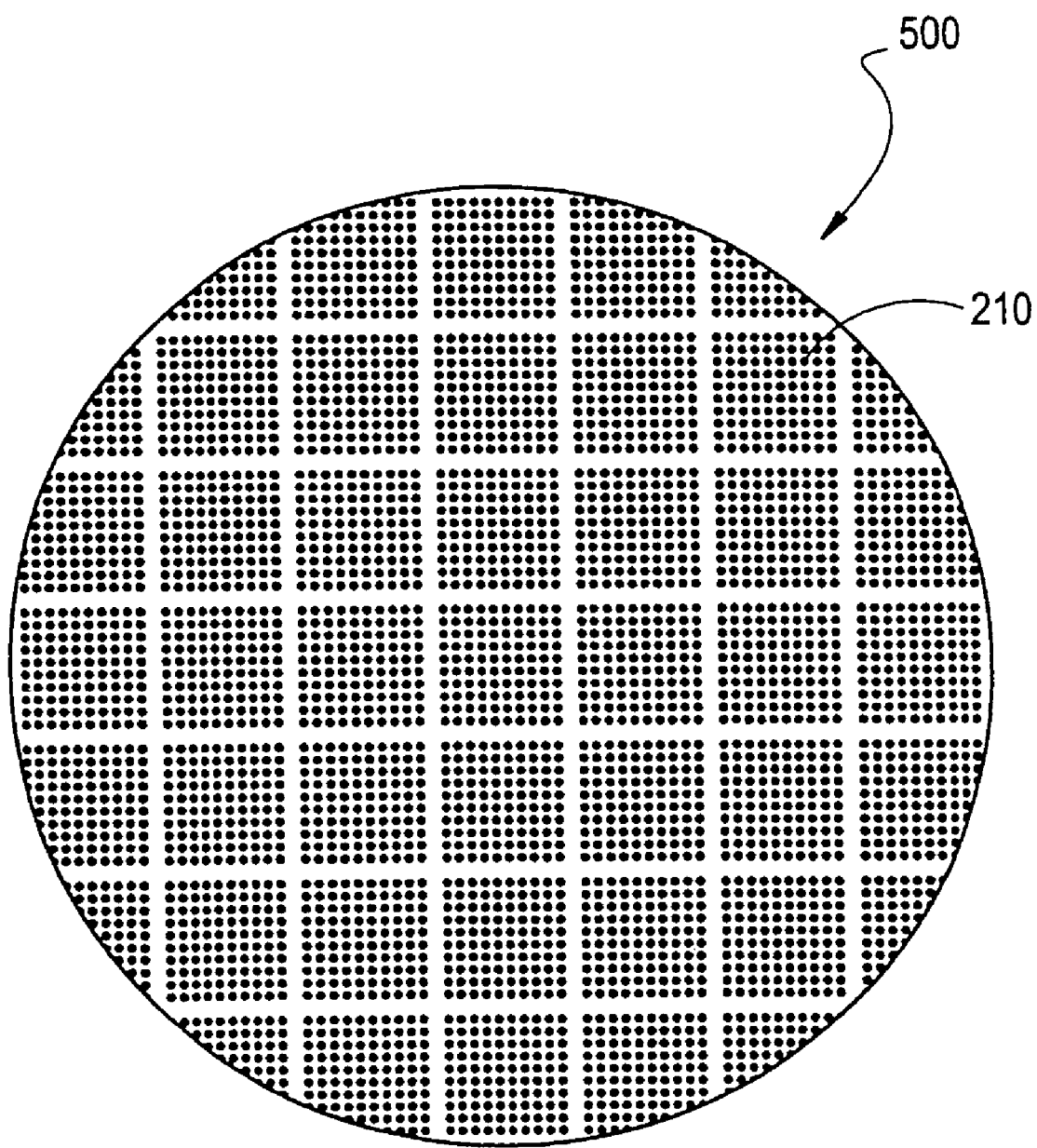
FIG. 5 illustrates a wafer comprising IC chips.

According to the third exemplary embodiment, IC chips are provided in wafer form (each wafer including a plurality of IC chips) and the wafers are cut into individual dice (each die including a single IC chip) (step 401). A wafer 500 is illustrated in FIG. 5. The wafer 500 includes a plurality of IC chips 210. The severing of the wafers into individual chips may be performed either mechanically or chemically.

Figure 6A:
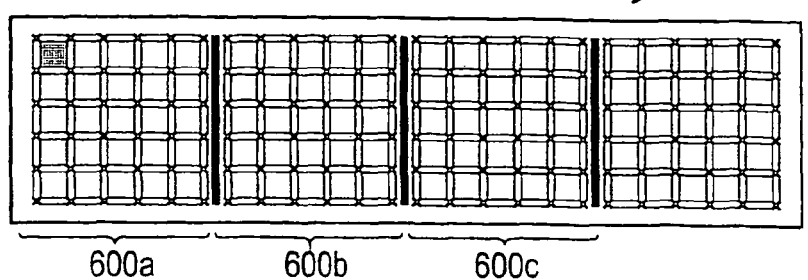
FIG. 6a illustrates a leadframe carrier.
Figure 6B:
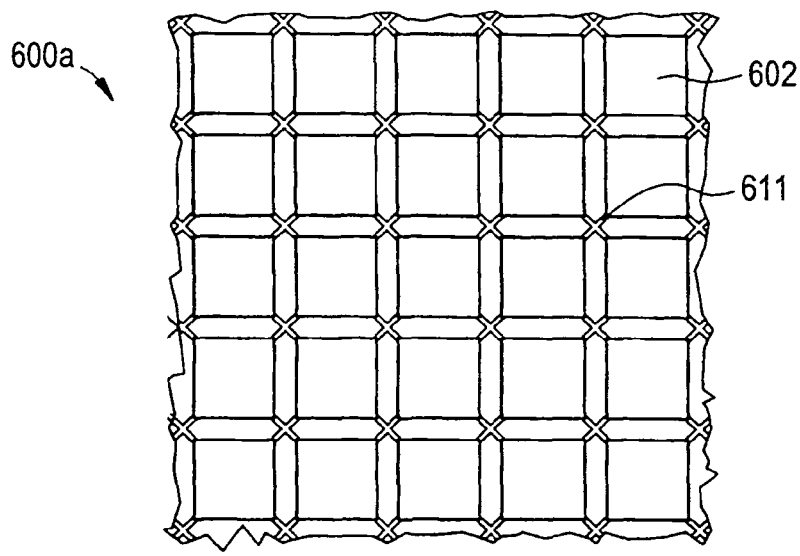

Adhesive is applied to die pad portions of a leadframe (step 402). The leadframe, as illustrated in FIGS. 6a and 6b may be formed of a number of known materials, as described above with respect to the base support of the first exemplary embodiment. FIG. 6A illustrates a leadframe carrier 600 including a plurality of leadframe panels 600a, 600b, and 600c. FIG. 6B illustrates an enlarged view of a leadframe panel 600a. The panel 600a includes a plurality of die pad portions 602, arranged in a grid-like formation, attached to neighboring die pad portions 602 by a plurality of tie bars 611. The adhesive applied to the die pad portions of the leadframe may be electrically conductive or non-conductive epoxy, paste, or adhesive tape, as described above with respect to the adhesive material of the first exemplary embodiment.

Figure 6C:
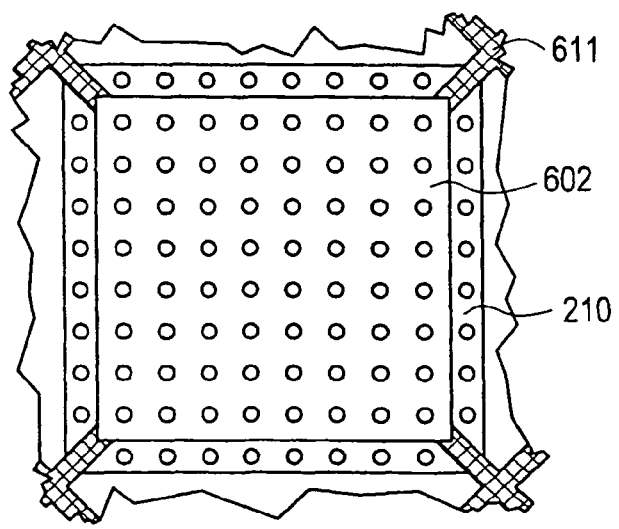
FIG. 6c illustrates an individual IC chip mounted on a die pad portion.

Individual IC chips, singulated in step 401, are mounted to the die pad portions 602 via the adhesive material (step 403). Steps 402 and 403 may be repeated until an IC chip 210 is mounted to each die pad portion 602. An individual IC chip 210 mounted on a die pad portion 602 is illustrated in FIG. 6C. As shown, the footprint of the IC chip is larger than that of the die pad portion 602. This difference in size allows for the IC chip to be encapsulated on all sides during the encapsulation molding process described below. The encapsulation on all sides of the IC chip provides for significantly increased stability and protection for the elements of the resultant package. Also, as discussed above, having encapsulant on all sides of the IC chip also enables a standard package size to multiple different chip sizes, thus enabling the use of a standard set of hardware for package testing and transportation.

Once the IC chips are mounted on the die pad portions 602, the carrier having the IC chips mounted thereon is placed in a oven and the adhesive is cured (step 404). The entire element, including the leadframe and the IC chips, are subjected to plasma cleaning process (step 405).

The carrier and the attached IC chips are then subjected to encapsulation molding (step 406).

Figure 7:
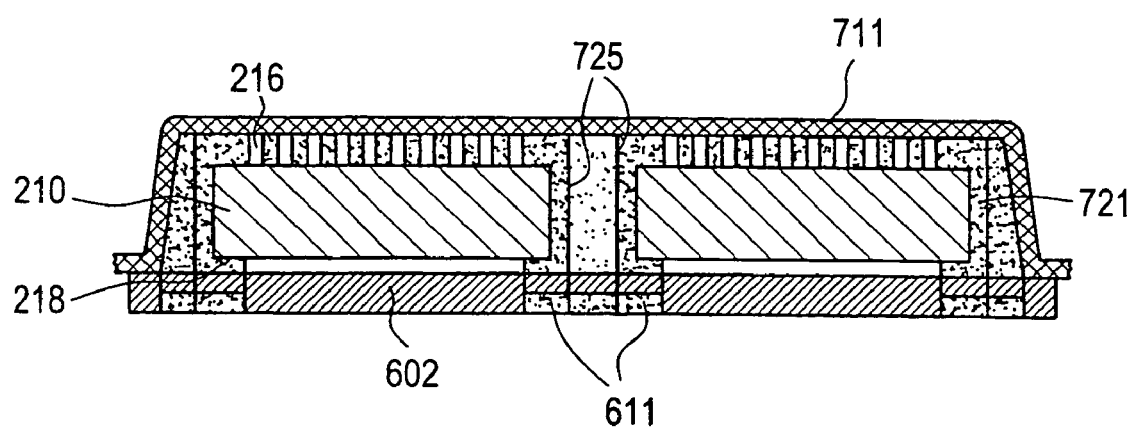
FIG. 7 illustrates an encapsulation mold according to the third exemplary embodiment.

The encapsulation molding process is illustrated in FIG. 7. After plasma cleaning, the carrier with tie bars 611 and the attached IC chips 210, is loaded onto a bottom mold tooling (step 406a). The upper and side faces of the IC chips are covered with a release film 711 which is rolled forward and propagated into the mold tooling (step 406b). At the same time, used release film is rolled up onto a used-up roll. The release film, which may be composed of ETFE, can withstand high molding temperatures and at the same time is flexible enough to inhibit mold flash on the upper ends of the pillar bumps 216. The release film also acts as a cushion to protect the IC chips form damage due to the clamping of the mold tooling. The carrier and the release film 711 together form a cavity 721 inside which the IC chips are located. The mold tooling is then subjected to vacuum suction which causes the release film 711 to shape itself over the cavity so that it contacts the upper ends of the pillar bumps 216 on the upper faces of the IC chips 210 (step 406c) (see FIG. 7). The mold is then closed, and an encapsulant material, as described above with respect to the first exemplary embodiment, is injected into the cavity 721, around the IC chips 210, and is cured (step 406d). After a cure cycle of approximately 90-120 seconds, the mold is opened, automatically removing the release film 711 from the molded IC chips and exposing the pillar bumps 216 (step 406e). As described above, while the mold is closed, the upper surfaces of the pillar bumps 216 are in contact with the release film 711. This contact between the tops of the pillar bumps 216 and the release film 711 prevents any of the encapsulant compound from seeping onto the pillar bump tops, thus exposing clean pillar bumps 216 when the release film 711 is removed. After the mold is opened, a de-flash process as understood in the art may be carried out on the substantially planar surface formed by the upper surface of the encapsulant and the upper ends of the pillar bumps (step 407).

A paste is printed onto the encapsulated elements with use of a device called a stencil as would be understood in the art (step 409). The paste may comprise minute eutectic solder balls of Sn/PB or of pure tin (Sb), mixed together with flux. Alternately, the solder balls are formed on the substantially planar surface, at locations corresponding to the upper ends of the pillar bumps (step 408). The paste or solder balls are then subjected to a reflow process, as would be understood in the art (step 410).

Finally, the encapsulated IC chips and the carrier are marked or laser-etched on their reverse (lower) surface (step 411a) and are sawed into individual packages along imaginary package saw lines 725 (step 411b). This cutting can be performed either mechanically or chemically.

Figure 8:
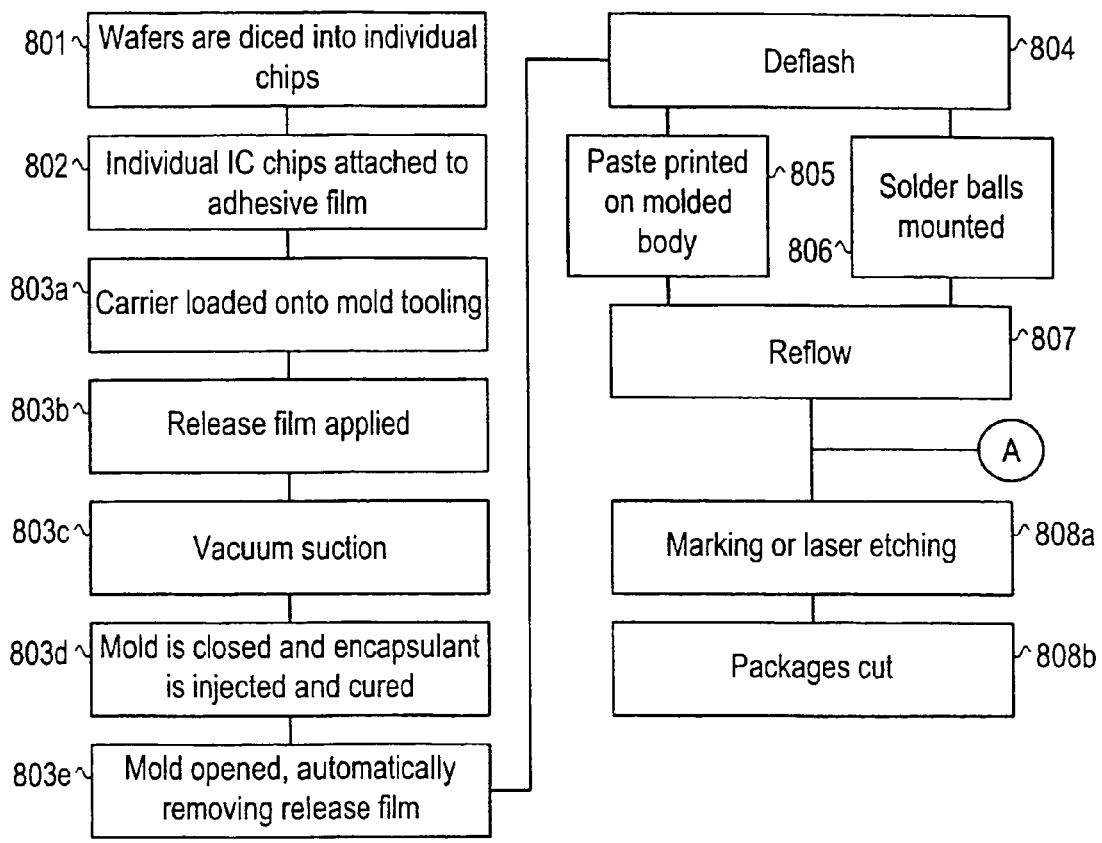
FIG. 8 is a flow chart illustrating the steps of a method of producing a structurally-enhanced IC package according to a fourth exemplary embodiment of the present invention.

FIG. 8 is a flow chart illustrating the steps of a method of producing a structurally-enhanced IC package according to a fourth exemplary embodiment of the present invention.

According to the fourth exemplary embodiment, as described above with respect to the third exemplary embodiment and FIG. 5, IC chips are provided in wafer form (each wafer including a plurality of IC chips) and the wafers are cut into individual dice (each die including a single IC chip) (step 801). Also as discussed with respect to the third exemplary embodiment, the severing of the wafers into individual chips may be performed either mechanically or chemically.

Figure 9:
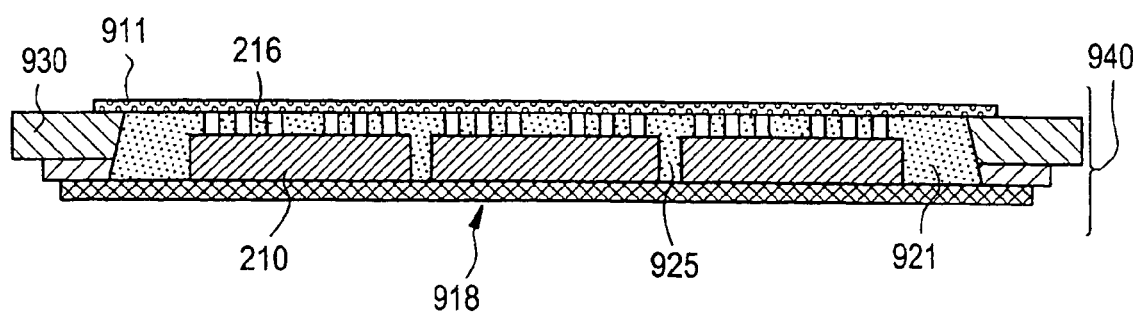
FIG. 9 illustrates an encapsulation mold according to the fourth exemplary embodiment.
Figure 10A:
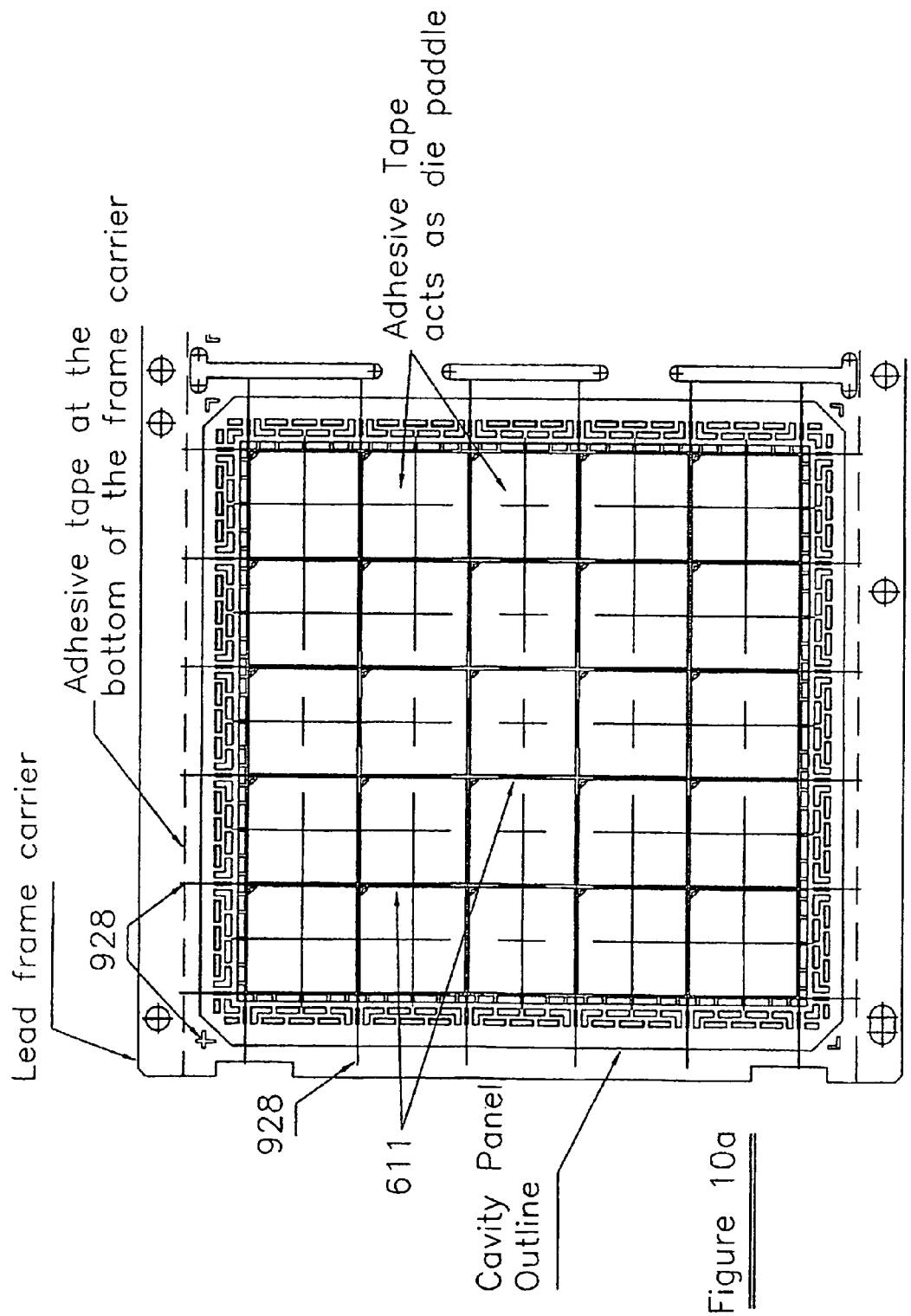

The IC chips are then subjected to encapsulation molding (step 802). The individual chips are attached to a carrier 940, as illustrated in FIG. 9 (step 802a). The carrier includes an adhesive film 918, capable of withstanding high temperatures, and a plurality of fiducials in line with saw lines 928, as shown in FIG. 10b. The carrier 940 is formed by attaching the adhesive film 918 to the tie bars 611 of the carrier frame. The adhesive film 918 then acts as a die pad portion to support the IC chips 210 during the encapsulation process.

The IC chips are attached to an upper side of the adhesive film 918 (step 802). The carrier and the attached IC chips are then subjected to encapsulation molding (step 803). The carrier with the attached IC chips is loaded onto a bottom mold tooling (step 803a). The upper faces of the IC chips are then covered with a release film 911, which is rolled forward and propagated into the mold tooling (step 803b). As discussed with respect to the third exemplary embodiment, at the same time, used release film is rolled up onto a used-up roll. The release film 911, which may be composed of ETFE, can withstand high molding temperatures and at the same time is flexible enough to inhibit mold flash on the upper ends of the pillar bumps 216. The release film 911 also acts as a cushion, as discussed above. The carrier 940 and the release film 911 together form a cavity 921 inside which the IC chips 210 are located.

The mold tooling is then subjected to vacuum suction which causes the release film 911 to shape itself over the cavity so that it contacts the upper ends of the pillar bumps 216 on the upper faces of the IC chips 210 (step 803c) (see FIG. 9). The mold is then closed and an encapsulant material, as discussed above, is injected into the cavity 921, around the IC chips 210, and is cured (step 803d).

As discussed above with respect to the third exemplary embodiment, after a cure cycle, the mold is opened, removing the release film 911 and exposing the pillar bumps 216 (step 803e).

After the mold is opened, a de-flash process as understood in the art may be carried out on the substantially planar surface formed by the upper surface of the encapsulant and the upper ends of the pillar bumps (step 804).

As described above with respect to the third exemplary embodiment, a paste is printed onto the encapsulated elements (step 806), or solder balls are formed (step 805), and the paste or solder balls are then subjected to a reflow process (step 807). Finally, the encapsulated IC chips and the carrier are marked or laser-etched on their reverse (lower) surface (step 808a) and are sawed into individual packages along imaginary saw lines 925 (step 808b). This cutting can be performed either mechanically or chemically.

Figure 11:
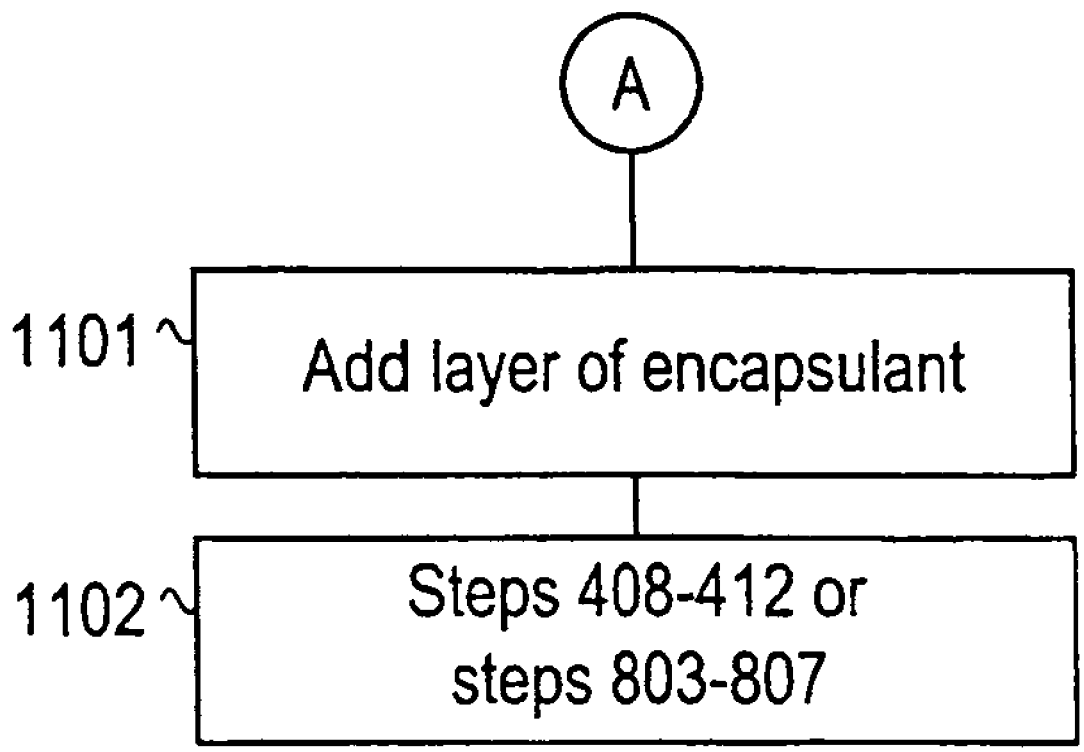
FIG. 11 illustrates a an exemplary aspect of the third and fourth exemplary embodiments.

FIG. 11 illustrates an exemplary aspect of the third and fourth exemplary embodiments. According to this further method, extended joints 219, as illustrated in FIG. 3, are formed. A second layer of encapsulant material, as described above with respect to the second exemplary embodiment, is applied around the solder balls by molding or by needle dispense (step 1101). This application of encapsulant material leaves the upper ends of the solder balls exposed. Subsequently, above-described steps 408-412b of the third exemplary embodiment or steps 804-808b of the fourth exemplary embodiment are performed again in order to form a second layer of solder balls and to cut the strips into packages.

According to traditional methods, wafer level packaging involves a large investment in terms of both infrastructure and equipment. A benefit of the above-described third and fourth exemplary embodiments is that a robust wafer level chip scale package (CSP) can be produced using existing equipment previously used for traditional Quad-Flat No-lead (QFN) packages.

Although the above exemplary embodiments of the present invention have been described, it will be understood by those skilled in the art that the present invention should not be limited to the described exemplary embodiments, but that various changes and modifications can be made within the spirit and scope of the present invention. Accordingly, the scope of the present invention is not limited to the described range of the following claims.

What is claimed is:

1. A chip scale integrated circuit package, comprising:
   an integrated circuit chip, having a first face and a second face;
   a plurality of pillar bumps formed on the first face of the integrated circuit chip;
   an encapsulant material encapsulating the sides and first face of the integrated circuit chip, and the pillar bumps, such that upper ends of the pillar bumps remain free from encapsulant material and such that a substantially planar surface is formed by an upper surface of the encapsulant material and the upper ends of the pillar bumps; and
   a die pad having a footprint smaller than a footprint of the integrated circuit chip and having a first face and a second face;
   wherein the encapsulant material further encapsulates the second face of the integrated circuit chip and the sides of the die pad.

2. The chip scale integrated circuit package according to claim 1, further comprising:
   an adhesive layer formed on the first face of the die pad;
   wherein the second face of the integrated circuit chip is mounted on the first face of the die pad via the adhesive layer.

3. The chip scale integrated circuit package according to claim 1, further comprising a plurality of solder balls mounted on the substantially planar surface in locations corresponding to the upper ends of the pillar bumps.

4. A chip scale integrated circuit package, comprising:
   an integrated circuit chip, having a first face and a second face;
   a plurality of pillar bumps formed on the first face of the integrated circuit chip;
   an encapsulant material encapsulating the sides and first face of the integrated circuit chip, and the pillar bumps, such that upper ends of the pillar bumps remain free form encapsulant material and such that a first substantially planar surface is formed by an upper surface of the encapsulant material and the upper ends of the pillar bumps;
   a second encapsulant material encapsulating the first substantially planar surface and the first plurality of solder balls such that an upper portion of each of the first plurality of solder balls remains free from the second encapsulant material; and
   a die pad having a footprint smaller than a footprint of the integrated circuit chip and having a first face and a second face;
   wherein the encapsulant material further encapsulates the second face of the integrated circuit chip and the sides of the die pad.

5. The chip scale integrated circuit package according to claim 4, further comprising:
   an adhesive layer formed on the first face of the die pad;
   wherein the second face of the integrated circuit chip is mounted on the first face of the die pad via the adhesive layer.

6. The chip scale integrated circuit package according to claim 4, further comprising:
   a first plurality of solder balls mounted on the first substantially planar surface in locations corresponding to the upper ends of the pillar bumps; and
   a second plurality of solder balls mounted on the upper portions of the first solder balls.

7. A method of assembling a chip scale integrated circuit package, comprising:
   a) applying an adhesive to a plurality of die pad portions of a leadframe;
   b) mounting an integrated circuit chip to each of the plurality of die pad portions via the adhesive, where the footprint of each of the integrated circuit chips is larger than the footprint of each of the plurality of die pad portions;
   c) attaching the die pad portions to a carrier;
   d) forming pillar bumps on the upper face of each of the integrated circuit chips;
   e) applying a release film over the integrated circuit chips such that the release film is in contact with the upper ends of the pillar bumps, thereby forming a cavity in which the integrated circuit chips are located;
   f) injecting encapsulant into the cavity;
   g) curing the encapsulant;
   h) removing the release film; and
   i) affixing a plurality of solder balls to the upper ends of the pillar bumps.

8. The method according to claim 7, further comprising:
   j) applying a layer of second encapsulant material around the solder balls such that an upper portion of each of the solder balls remains free from the layer of second encapsulant material; and
   k) affixing a second plurality of solder balls to the upper portions of each of the plurality of solder balls.

9. The method according to claim 8, further comprising:
   g) applying a layer of second encapsulant material around the solder balls such that an upper portion of each of the solder balls remains free from the layer of second encapsulant material; and
   h) affixing a second plurality of solder balls to the upper portions of each of the plurality of solder balls.

10. A method of assembling a chip scale integrated circuit package, comprising:
    a) attaching the lower face of a plurality of integrated circuit chips to a carrier;
    b) applying a release film over the integrated circuit chips such that the release film is in contact with the upper ends of pillar bumps formed on the upper face of each of the integrated circuit chips, thereby forming a cavity in which the integrated circuit chips are located;
    c) injecting encapsulant into the cavity;
    d) curing the encapsulant;
    e) removing the release film; and
    f) affixing a plurality of solder balls to the upper ends of the pillar bumps.

* * * * *